US006839257B2

United States Patent
Narita et al.

(10) Patent No.: US 6,839,257 B2
(45) Date of Patent: Jan. 4, 2005

(54) CONTENT ADDRESSABLE MEMORY DEVICE CAPABLE OF REDUCING MEMORY CAPACITY

(75) Inventors: Yuki Narita, Mihama-ku (JP); Tomoo Tsuda, Mihama-ku (JP); Masahiro Konishi, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 26 days.

(21) Appl. No.: 10/431,387

(22) Filed: May 8, 2003

(65) Prior Publication Data

US 2004/0085825 A1 May 6, 2004

(30) Foreign Application Priority Data

May 8, 2002 (JP) ........................................ 2002-132422

(51) Int. Cl.$^7$ ................................................ G11C 15/00
(52) U.S. Cl. ........................................ 365/49; 365/200
(58) Field of Search .......................... 365/49, 200, 201, 365/230.03

(56) References Cited

U.S. PATENT DOCUMENTS 6,597,595 B1 * 7/2003 Ichiriu et al. .................. 365/49
6,611,445 B2 * 8/2003 Kanazawa et al. ............. 365/49
6,714,466 B2 * 3/2004 Park et al. .................... 365/200

FOREIGN PATENT DOCUMENTS

JP   A-2000-30487   1/2000

OTHER PUBLICATIONS

"A 1–Mb 2–Tr/b Nonvolatile CAM Based on Flash Memory Technologies", Tohru Miwa, Hachiro Yamada, Yoshinori Hirota, Toshiya Satoh, and Hideki Hara, IEEE Journal of Solid–State Circuits, vol. 31, No. 11, Nov. 1996.

* cited by examiner

Primary Examiner—Anh Phung
(74) Attorney, Agent, or Firm—Oliff & Berridge, PLC (57) ABSTRACT

The invention provides a content addressable memory device having the capability of functioning as a content addressable memory device with a reduced memory capacity even when the device includes a large number of failed words in some memory blocks.

To achieve the above object, the content addressable memory device according to the present invention includes a memory part including a plurality of memory blocks which can be controlled independently of each other, a failed memory block information memory for, when there is a failed memory block, storing address information associated with the failed memory block and outputting a signal indicating the failed memory block, and an encoder for, in accordance with the signal and an address input from the outside, outputting a memory block selection signal to the respective memory blocks to enable a memory block other than the failed memory block without enabling the failed memory block.

20 Claims, 7 Drawing Sheets

EFFECTIVE ADDRESS: (K+L) BITS FOR REDUCTION = "0"
(K+L–1) BITS FOR REDUCTION = "1"

| ADDRESS [MSB] | REDUCTION | FAILPLANE | ENABLE0 | ENABLE1 |
|---|---|---|---|---|
| 0 | 0 | --- | 1 | 0 |
| 1 | 0 | --- | 0 | 1 |
| --- | 1 | 0 | 0 | 1 |
| --- | 1 | 1 | 1 | 0 |

FIG. 6

| FLAG0 | FLAG1 | FLAG | HA |
|-------|-------|------|-----|
| 0 | 0 | 0 | --- |
| 1 | --- | 1 | HA0 |
| 0 | 1 | 1 | HA1 |

CONTENT ADDRESSABLE MEMORY DEVICE CAPABLE OF REDUCING MEMORY CAPACITY

FIELD OF THE INVENTION

The present invention relates to a content addressable memory device capable of reducing memory capacity when the device includes failed memory words.

DESCRIPTION OF THE RELATED ART

When search data is input in content addressable memory (hereinafter, referred to as CAM), memory words (hereinafter, referred to as words) are searched, usually in a single cycle, to detect data which matches the input search data. As a result of searching, information indicating whether words including data which matches the search data have been found and addresses of the words including data which matches the search data are output, and furthermore all data stored in the words can be output.

Use of the CAM makes it possible to search desired data from a huge amount of stored data in a very short time. Because of the advantages described above, the CAM is used to enhance the performance of a system in which searching is performed frequently.

A conventional CAM device is described below. Herein, a memory device having circuit blocks for realizing various functions needed in a CAM, in addition to a memory part, is referred to as a CAM device.

Figure 11:
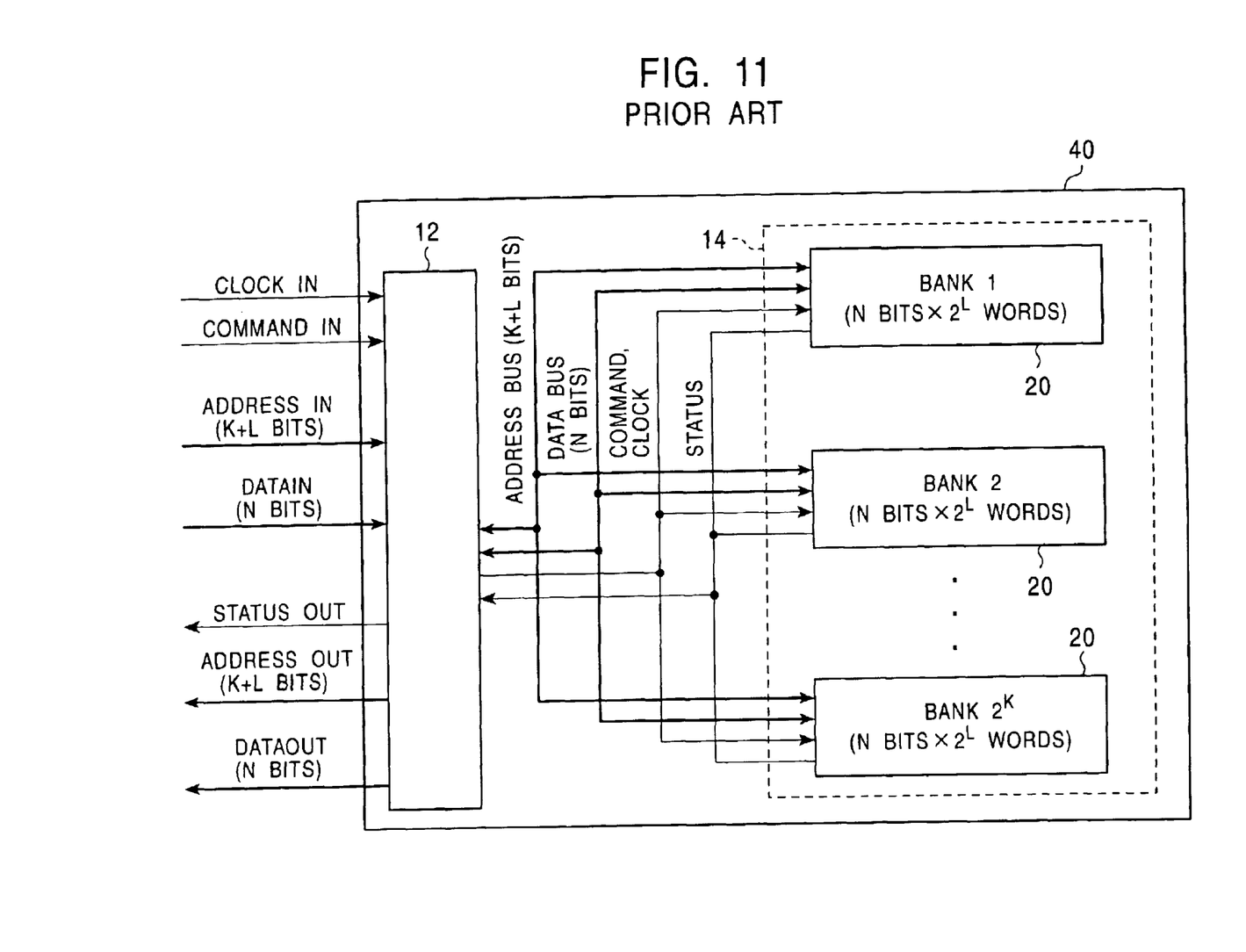
FIG. 11 is a schematic diagram showing an example of a conventional CAM device.

FIG. 11 is a schematic diagram showing an example of a conventional CAM device having a memory part divided into a plurality of banks.

The CAM device 40 shown in FIG. 11 includes a logic part 12 for controlling the general operation of the CAM device 40, and a memory part 14 including a plurality of words. The memory part 14 is divided into $2^K$ banks 20, each of which includes $2^L$ words. Assuming that each word includes N bits, the memory part 14 has as many CAM cells as N bits×$2^{K+L}$ in total. Each bank can be controlled independently by the logic part 12.

A clock, a command, an address, and data (to be stored or searched for) are input to the logic part 12 from the outside of the CAM device 40. On the other hand, a status signal, an address, and data are output from the logic part 12 to the outside of the CAM device 40. A command and a clock are input from the logic part 12 to the memory part 14, and a status signal is input from the memory part 14 to the logic part 12. The logic part 12 and the memory part 14 are connected to each other via a (K+L)-bit address bus and an N-bit data bus.

The CAM device 40 operates in synchronization with the clock input from the outside. One of banks 20 in the memory part 14 is specified by high-order K bits of an address input from the outside, and one of words in the specified bank 20 is specified by low-order L bits of the address.

For example, when data is written into the memory part 14, an address specifying a word into which the data should be written, and data to be written into the specified word are input to the CAM device 40. If a command to write data is input, the logic part 12 specifies a bank 20 and a word corresponding to the input address, and the data is written into the specified word.

When data stored in the memory part 14 is read out, an address specifying a word from which the data is to be read and a command to read data are input. In response, the logic part 12 specifies a bank 20 and a word corresponding to the input address, and the logic part 12 reads data stored in that word. The read data is output to the outside via the logic part 12.

When searching is performed, search data is input to the CAM device 40. If a command to perform searching is further input, the memory part 14 compares the search data with data stored in the respective words at the same time, and outputs a status signal indicating the result of searching to the outside of the CAM device 40 via the logic part 12.

Thus, on the basis of the status signal, it is possible to know whether there is a word in which data matching the search data is stored. When words storing data which matches the search data are detected, if a command to output the word addresses at which data matching the search data is stored is input, an address of a word having the highest priority, of those of all words detected to include data which matches the search data, is output.

If an address identical to the address of the word having the highest priority output from the CAM device 40 is input, and if a command to read the data is further input, the data stored in that word is read out.

Furthermore, reading of an address of a word in which data matching the search data is stored, and reading of the data stored in that word may be performed repeatedly according to the priority order. As described above, reading of words storing data which matches the search data and reading of data stored in those words can be performed at a high speed.

As the memory capacity of CAM increases and the sizes of device elements decrease, improvement in production yield becomes more important. In addition to controlling the production process, it is known to improve in the production yield by designing CAM devices taking into account the possibility that CAM devices may include a certain number of failed words. For example, a certain number of redundant (spare) words are prepared in each bank so that a failed word can be replaced with a redundant word.

However, when the memory capacity of the CAM device increases, the memory capacity of each bank increases and thus the number of failed words in each bank also increases. When a bank includes a large number of failed words, all failed words cannot be replaced with redundant words prepared in that bank, and consequently that CAM device cannot be used.

SUMMARY OF THE INVENTION

In view of the aforementioned problems in the conventional technique, an object of the present invention is to provide a CAM device having the capability of functioning as a CAM device with a reduced memory capacity even when the CAM device includes a large number of failed words in some memory blocks.

To achieve the object described above, the present invention provides a content addressable memory device comprising a memory part including a plurality of memory blocks which can be controlled independently of each other, a failed memory block information memory for, when there is a failed memory block, storing address information associated with the failed memory block and outputting a signal indicating the failed memory block, and an encoder for, in accordance with the signal and an address input, outputting a memory block selection signal to the respective memory blocks to enable a memory block other than the failed memory block without enabling the failed memory block.

The plurality of memory blocks may be memory banks or independently controllable sub-blocks in memory banks.

Preferably, the memory part is divided into blocks the number of which is equal to a power of 2. When each memory block includes a plurality of sub-blocks which can be controlled independently of each other, it is desirable that each memory block is divided into sub-blocks the number of which is equal to a power of 2.

Preferably, the content addressable memory device further includes a selector for selectively outputting data output from the respective memory blocks in accordance with a memory block selection signal output from the encoder, and a selector for selectively outputting, in accordance with predetermined priority, a flag indicating whether a memory block includes at least one hit word in the searching and the address of the hit word output from the memory block.

The signal indicating a failed memory block may be set independently for each memory block such that a sub-block may be specified differently from one memory block to another.

Preferably, the content addressable memory device further includes an address converter for, in a mode in which the memory capacity of the memory part is reduced, performing an address conversion between an address having a particular number of bits used in the CAM device and an address which has a particular number of bits corresponding to the reduced memory capacity and which is used in the outside of the CAM device.

Preferably, in a mode in which the memory capacity of the memory part is reduced to the reciprocal of a power of 2, the address converter produces an address such that, when an address with a width in bits corresponding to the memory capacity reduced to the reciprocal of a power of 2 is input to the CAM device from the outside, the address converter inserts dummy bits, the number of which corresponds to at least one address bit specifying the memory block, at an address bit location specifying the memory block thereby producing an address with a width in bits equal to a specific value used in the CAM device. When an address with a particular width in bits is output from the memory part, the address converter removes bits, the number of which corresponds to the at least one address bit specifying the memory block, at bit locations specifying the memory block from the address thereby producing an address with a width in bits corresponding to the memory capacity reduced to the reciprocal of the power of 2.

DETAILED DESCRIPTION OF THE INVENTION

The CAM device according to the present invention is described in further detail below with reference to preferred embodiments in conjunction with the accompanying drawings.

Figure 1:
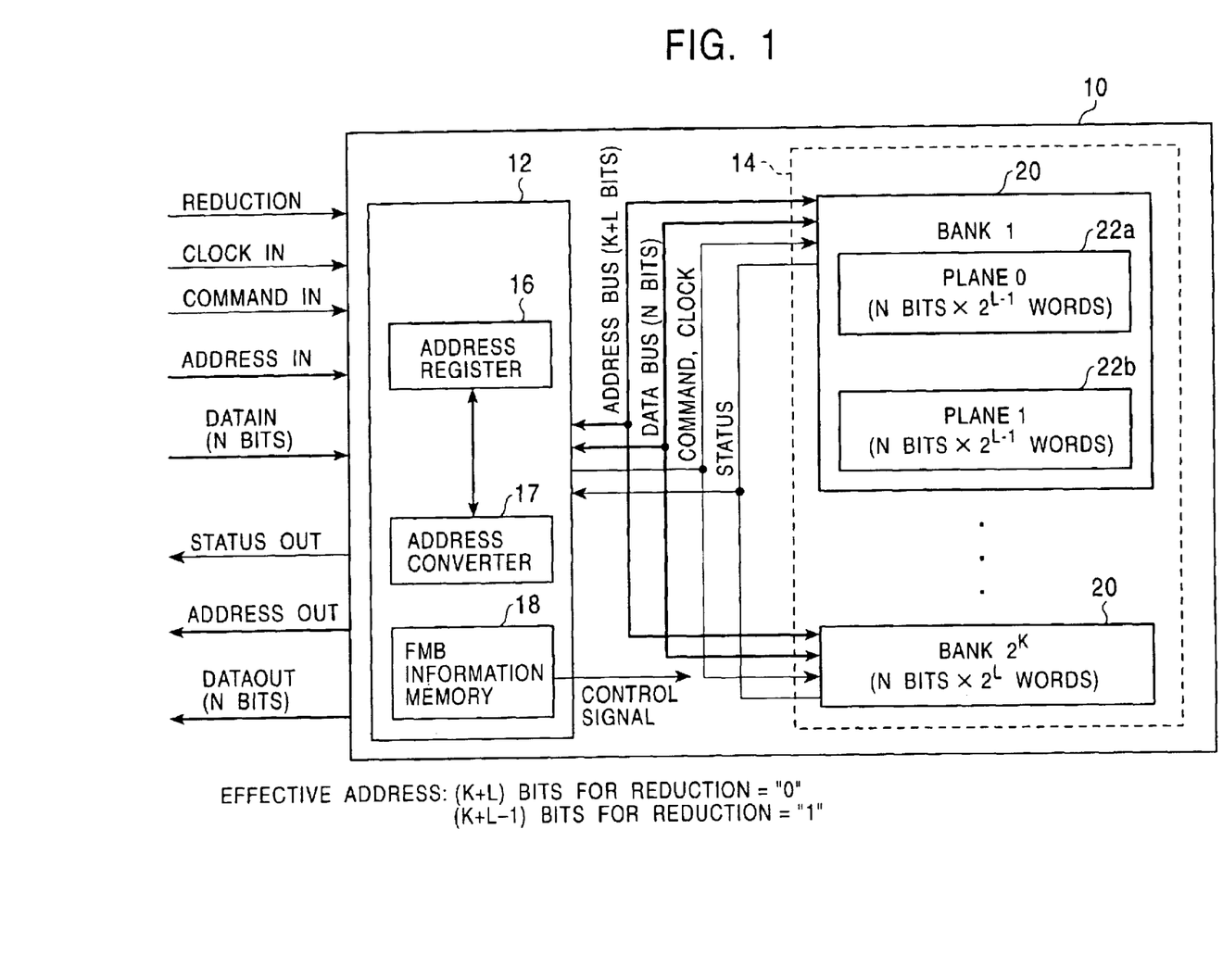
FIG. 1 is a schematic diagram showing a CAM device according to an embodiment of the present invention.

FIG. 1 is a schematic diagram of a CAM device according to an embodiment of the present invention.

The CAM device 10 shown in FIG. 1 has the capability of functioning as a device having a reduced memory capacity when it includes a failed memory block. This CAM device 10 shown in FIG. 1 is an example achieved by applying the present invention to the conventional CAM device 40 shown in FIG. 11. In FIG. 1, for simplicity, similar parts to those in FIG. 11 are denoted by similar reference numerals.

The CAM device 10 includes a logic part 12 for controlling the general operation of the CAM device 10, and a memory part 14 including a plurality of words.

The logic part 12 includes an address register 16 for storing an address input from the outside to the CAM device 10 and an address output from the memory part 14 of the CAM device 10, an address converter 17 for performing, using the address register 16, an address conversion between an address used in the CAM device 10 and an address used outside the CAM device 10, and a failed memory block information memory (hereinafter, referred to as a FMB memory) for, when there is a failed memory block, storing address information associated with the failed memory block and outputting a signal indicating the failed memory block.

The FMB memory 18 stores information indicating whether there is a failed memory block. In a case in which there is a failed memory block, the FMB memory 18 also stores address information associated with the failed memory block. In the present embodiment, the FMB memory 18 outputs a signal denoted as FAILPLANE in FIG. 2. The FMB memory 18 includes a plurality of fuses. If a failed memory block is detected in a probing test after production, the address information associated with the detected failed memory block is stored by cutting a fuse corresponding to the detected failed memory block. Note that in the present invention, the FMB memory 18 is not necessarily needed to be configured in the above described manner. For example, the address information may be stored in a register formed of a nonvolatile memory, or other known means may be employed. The address conversion will be described later.

A signal REDUCTION, which is a control signal to reduce a memory capacity, is input to the logic part 12 from the outside of the CAM device 10. Alternatively, this control signal to reduce the memory capacity may be output from the FMB memory 18. In the present embodiment, as a result of the address conversion, the number of bits of input and output addresses becomes equal to (K+L) bits when the signal REDUCTION="0" and (K+L−M) when the signal REDUCTION="1", where M is such a value that $2^M$ indicates the number of planes in one bank.

The memory part 14 is divided into $2^K$ banks 20 (bank 1, bank 2, ..., bank $2^K$). In the following description, for simplicity, each bank 20 is assumed to be divided into two planes 22a and 22b (plane 0 and plane 1). That is, it is assumed that M=1. Each bank 20 includes $2^L$ words, and each word includes N bits. Each of the plane 0 and plane 1 includes $2^{L-1}$ words.

In the present embodiment, planes in banks are used as memory blocks of the present invention. Each bank is a memory block which can be controlled independently by the logic part 12 and include a bit line driver and a word line driver. In the present embodiment, planes included in each bank are submemory blocks which are independently controllable in the bank.

A command and a clock are input to the memory part 14 from the logic part 12, and a status signal is input to the logic part 12 from the memory part 14. The logic part 12 and the memory part 14 are connected to each other via a (K+L)-bit width address bus and an N-bit width data bus.

Figure 2:
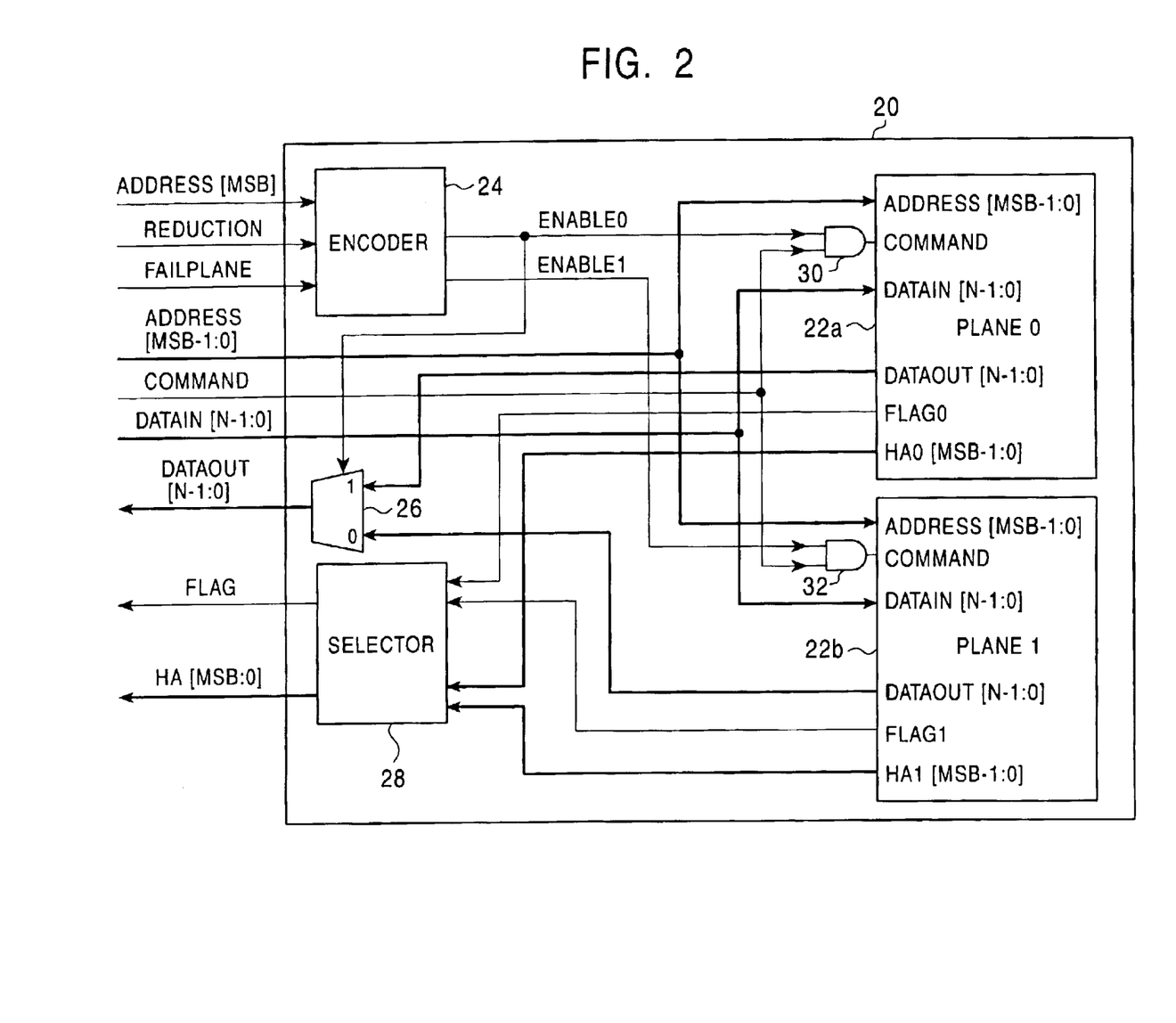
FIG. 2 is a schematic diagram showing an internal structure of a bank of the CAM device, according to an embodiment of the present invention.

Next, the internal structure of each bank 20 of the memory part 14 is described below.

FIG. 2 is a schematic diagram showing an example of the internal structure of a bank. As shown in FIG. 2, each bank 20 includes, in addition to two planes 22a and 22b (a plane 0 and a plane 1), an encoder 24, a data selector 26, a flag/address selector 28, and two AND gates 30 and 32.

A bit ADDRESS[MSB] specifying a plane in a bank, a signal REDUCTION, and a signal FAILPLANE are input to the encoder 24. From the encoder 24, plane selection signals ENABLE0 and ENABLE1 are output to one of input terminals of the respective AND gates 30 and 32. The signal REDUCTION specifies the amount of reduction in the memory capacity of the memory part 14, and the signal FAILPLANE indicates a failed plane.

A signal COMMAND is input in common to the other one of the terminals of the respective AND gates 30 and 32, and the outputs of the AND gates 30 and 32 are input, respectively, to the input terminal COMMAND of the plane 0 and the input terminal COMMAND of the plane 1.

A signal ADDRESS[MSB-1:0] and a signal DATA[N-1:0] are input in common to both the plane 0 and the plane 1.

Signals output from the terminals DATAOUT of the respective plane 0 and plane 1 are input to the input terminals 1 and 0, respectively, of the data selector 26. The signal ENABLE0 output from the encoder 24 is input to a selection terminal of the data selector 26. A signal DATAOUT is output from the data selector 26.

To input terminals of the flag/address selector 28, signals indicating whether the plane 0 and plane 1 include at least one hit word in the searching are input from the output terminals FLAG0 and FLAG1 of the respective plane 0 and plane 1, and hit addresses are input from the output terminals HA0 and HA1. A signal FLAG and a hit address HA are output from the selector 28.

The operation of the CAM device 10 is described below.

First, a format of addresses used in the present embodiment is described.

Figure 3:
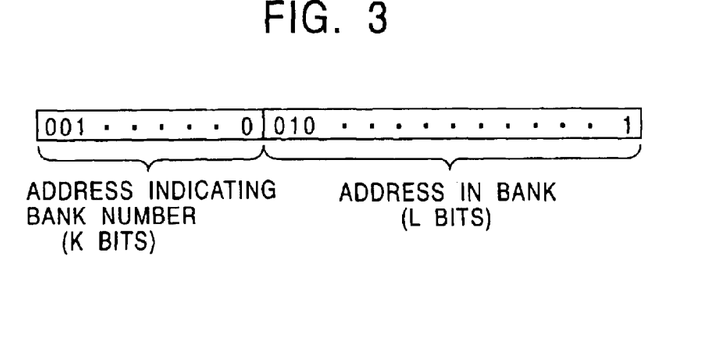
FIG. 3 is a conceptual diagram showing a format of a word address used in the inside of the CAM device, according to an embodiment of the present invention.

FIG. 3 is a conceptual diagram showing an example of an address format used in the CAM device. As shown in FIG. 3, one of banks 20 is specified by a high-order K bits of a (K+L)-bit address, and a particular one word in the specified bank 20 is specified by a low-order L bits of the address. A high-order M bits (ADDRESS[L-1:L−M]) of the low order L bits indicates a plane number, and the most significant bit thereof is ADDRESS[MSB] described earlier.

In the CAM device 10, when there is no failed plane, the signal REDUCTION is set to "0", while the signal REDUCTION is set to "1" when there is a failed plane.

In the following description, it is assumed that M=1 (that is, each bank includes two planes).

Figure 5:
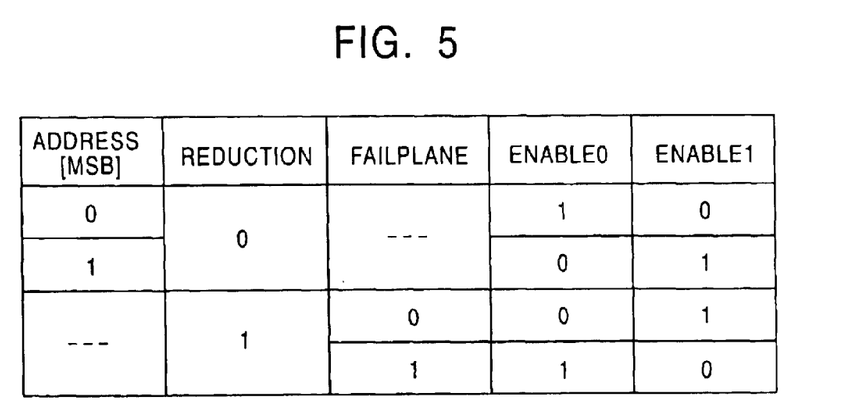
FIG. 5 is a truth table showing the relationship among signals in the CAM device according to the embodiment of the present invention.
Figure 6:
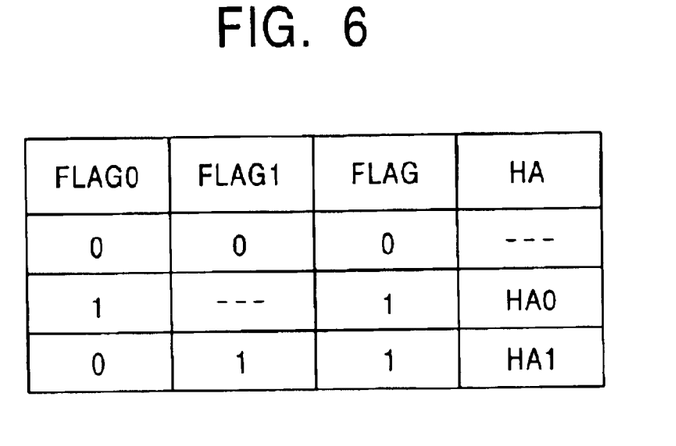
FIG. 6 is another truth table showing the relationship among signals in the CAM device according to the embodiment of the present invention.

When the signal REDUCTION is set to "0", as shown in TABLE 1 in FIG. 5, if the signal ADDRESS[MSB] is "0", the signal ENBALE0 output from the encoder 24 becomes "1" and the signal ENABLE1 becomes "0" regardless of the signal FAILPLANE. That is, the plane 0 is enabled, and the plane 1 is disabled. Conversely, when the signal ADDRESS[MSB] is "1", the signal ENABLE0 is set to "0" and the signal ENABLE1 is set to "1". In this case, the plane 1 is enabled and the plane 0 is disabled.

When the signal REDUCTION is set to "0", that is, when there is no failed plane, the writing, reading, and searching operations of the CAM device 10 are performed in the same manner as the conventional CAM device 40 shown in FIG. 11. In this case, as shown earlier, the address (input and output) has a width in bits equal to (K+L).

On the other hand, when the signal REDUCTION is set to "1", as shown in TABLE 1 in FIG. 5, the signal ENABLE0 output from the encoder 24 becomes "0" and the signal ENABLE1 becomes "1" regardless of the state of the signal ADDRESS[MSB]. That is, the plane 1 is enabled, and the plane 0 is disabled. Conversely, when the signal FAILPLANE is "1", the signal ENABLE0 becomes "1" and the signal ENABLE1 becomes "0". In this case, the plane 0 is enabled, and the plane 1 is disabled.

In other words, in the present embodiment, when the signal REDUCTION is "1", there is a failed plane and the memory capacity of the memory part 14 is reduced to one half When the signal REDUCTION is "1", if the signal FAILPLANE is "0", the plane 0 is failed, while the plane 1 is failed if the FAILPLANE is "1".

In the present embodiment, when there is a failed plane, all planes with the same plane number as the failed plane are disabled in all banks 20. For example, in the CAM device 10 shown in FIG. 1, when the plane 0 of the bank 1 at the top of FIG. 1 is failed, plane 0 of all the other banks 2, 3, ..., $2^K$ are also disabled.

Figure 4:
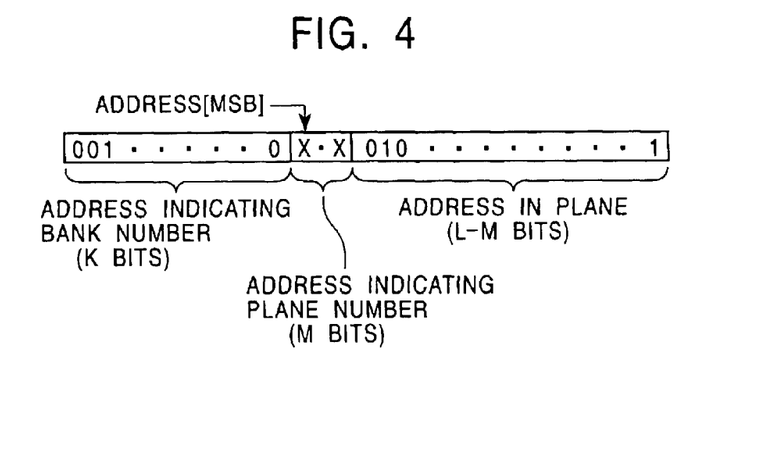
FIG. 4 is a conceptual diagram showing a format of a word address used, when there is a failed plane, in the CAM device according to an embodiment of the present invention.

Thus, as shown in FIG. 4, the effective (input and output) address width becomes (K+L−1) bits excluding the signal ADDRESS[MSB], thereby reducing the effective memory capacity to one half In this case, writing, reading, and searching are performed for only the selected planes, in exactly the same manner as in the case in which the signal REDUCTION is "0".

In the case in which the plane 0 is enabled, the data selector 26 selectively outputs, as an output signal DATAOUT, a signal output from the terminal DATAOUT of the plane 0. Conversely, when the plane 1 is enabled, the signal output from the terminal DATAOUT of the plane 1 is selectively output as the output signal DATAOUT.

The flag/address selector 28 selectively outputs a signal FLAG indicating whether a hit word is found in searching and also selectively outputs the address of the hit word (hit address), in accordance with predetermined priority. For example, the plane 0 has higher priority than the plane 1, the selector 28 first outputs the signals received from the output terminals FLAG0 and HA0 of the plane 0.

As described above, when the plane 0 has higher priority than the plane 1, if the signals output from the output terminals FLAG0 and FLAG1 of the respective plane 0 and plane 1 are both equal to "0", that is, if no data which matches the search data is stored in the bank 20 including those plane 0 and plane 1, the signal FLAG output from the selector 28 becomes "0". In this case, the signal HA is not output from the selector 28 (or an invalid value is output so that it is not used in the outside).

When the signal output from the output terminal FLAG0 of the plane 0 is "1", that is, when no data which matches search data is stored in the plane 0, the signal FLAG output from the selector 28 becomes "1" regardless of the status of the signal output from the output terminal FLAG1 of the plane 1. In this case, the selector 28 outputs, as signal HA, the signal received from the output terminal HA0 of the plane 0. In this case, the most significant bit of the signal HA output from the selector 28 becomes "0", because the signal from the plane 0 is selectively output.

On the other hand, when the plane 0 includes no storage data which matches search data but the plane 1 includes storage data, which matches search data, the signal FLAG output from the selector 28 becomes "1", and the signal output from the output terminal HA1 of the plane 1 is output as the signal HA from the selector 28. In this case, the most significant bit of the signal HA output from the selector 28 becomes "1", because the signal from the plane 1 is selectively output.

In the CAM device 10, as described above, where there is no failed plane, the CAM device 10 functions as a CAM device having words the number of which is equal to $2^{K+L}$ indicating the physical number of words. However, when there is a failed plane (that is, when a plane includes failed CAM words and that plane cannot be relieved), the failed plane is disabled, and the CAM device 10 functions as a CAM device having $2^{K+L-1}$ words. This allows an improvement in production yield of CAM devices.

Next, the address conversion is described below.

When there is a failed plane, if the memory capacity of each bank 20 is reduced to one half (when M=1), the address format becomes as shown in FIG. 4. That is, a bit corresponding to the ADDRESS[MSB] of an address input to the CAM device 10 from the outside is ignored in the CAM device 10, and, conversely, the bit ADDRESS[MSB] of an address output from the CAM device 10 to the outside is fixed to "0" or "1" which is meaningless and is not used in the outside.

However, when the CAM device 10 is shipped as a device having a reduced memory capacity, if an external pin corresponding to the signal ADDRESS[L−1:L−M] is enabled (used), the CAM device 10 cannot be managed easily. In this case, such a CAM device 10 becomes incompatible, in terms of external pins, with CAM devices which are originally designed to have the same memory capacity as the reduced memory capacity of the CAM device 10. To avoid the above problems, it is desirable that an external pin corresponding to the bit ADDRESS[L−1:L−M] is disabled (not used), and the address conversion is performed in the CAM device 10 so that the address used in the outside has an effective width of (K+L−M) bits.

In the mode in which the memory capacity is reduced, the address converter 17 performs an address conversion between an address used in the CAM device 10 having a width in bits corresponds to the physical memory capacity of the memory part 14 (the address width is equal to (K+L) bits, in this specific example) and an address used in the outside of the CAM device 10 and having a width in bits corresponding to the effective memory capacity equal to one-half the physical memory capacity (the effective address width is equal to (K+L−1) bits in this specific example).

A specific example of the address conversion is described below.

Figure 7:
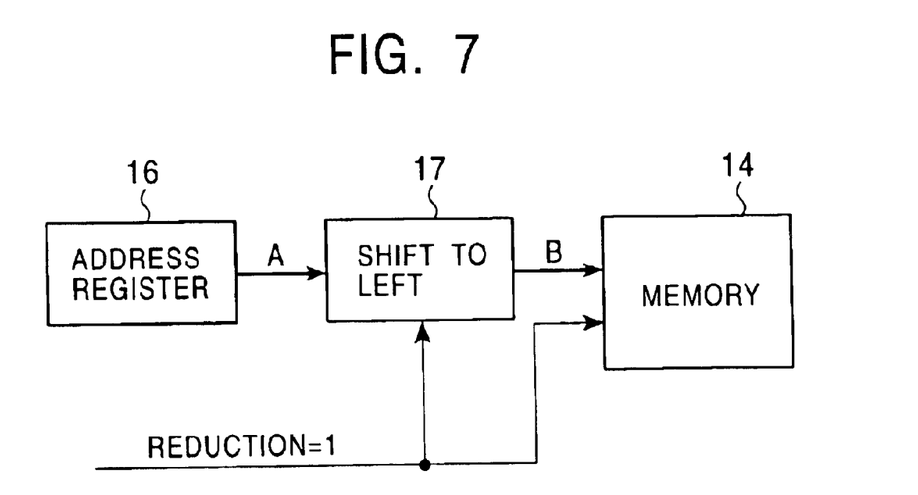
FIG. 7 is a conceptual diagram showing the operation of an address converter in the CAM device, according to an embodiment of the present invention.
Figure 8:
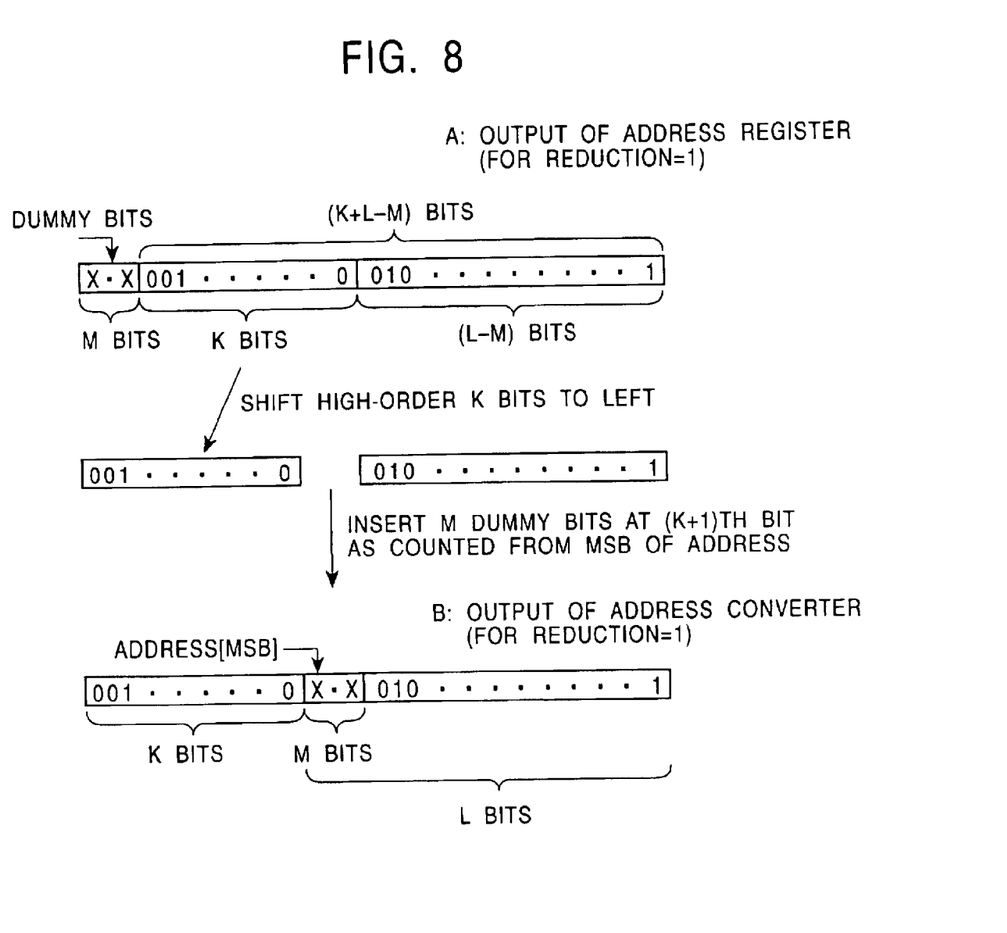
FIG. 8 is a conceptual diagram showing an example of the process of shifting an address in the CAM device according to an embodiment of the present invention.

FIG. 7 is a conceptual diagram showing an example of the operation of the address converter, and the FIG. 8 is a conceptual diagram showing an example of an address shifting operation. In this example, it is assumed that each bank includes $2^M$ planes, and the memory capacity of the memory part is reduced to $½^M$.

In the examples shown in FIGS. 7 and 8, when there is a failed plane, the address converter 17 converts an address with a width (K+L−M) bits input to the CAM device 10 from the outside into an address signal with a width (K+L) bits used in the CAM device 10, and the address converter 17 supplies the resultant converted address signal to the memory part 14.

When the signal REDUCTION is "1", that is, when there is a failed plane, the address with the width (K+L−M) input from the outside is stored in an address register 16 in the logic part 12. As shown in FIG. 8, the address signal A stored in the address register 16 includes a total of (K+L−M) bits including high-order K bits indicating a bank 20 and low-order (L−M) bits which do not include bits corresponding to the bits ADDRESS[L−1:L−M] and which indicate one word in the bank 20.

When the signal REDUCTION is "1", the address converter 17 converts the address with the width of (K+L−M) bits stored in the address register 16 such that high-order K bits indicating a bank are shifted by M bits to the left, that is, to higher-order locations, and M-bit dummy bits corresponding to bits ADDRESS[L−1:L−M] are inserted. As a result, an address B with a width (K+L) bits is output from the address converter 17 and supplied to the memory part 14.

Figure 9:
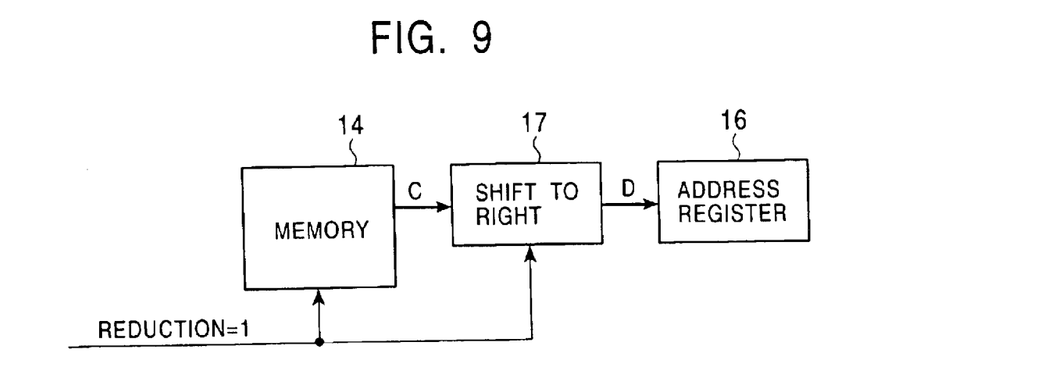
FIG. 9 is a conceptual diagram showing the operation of an address converter in the CAM device, according to another embodiment of the present invention.
Figure 10:
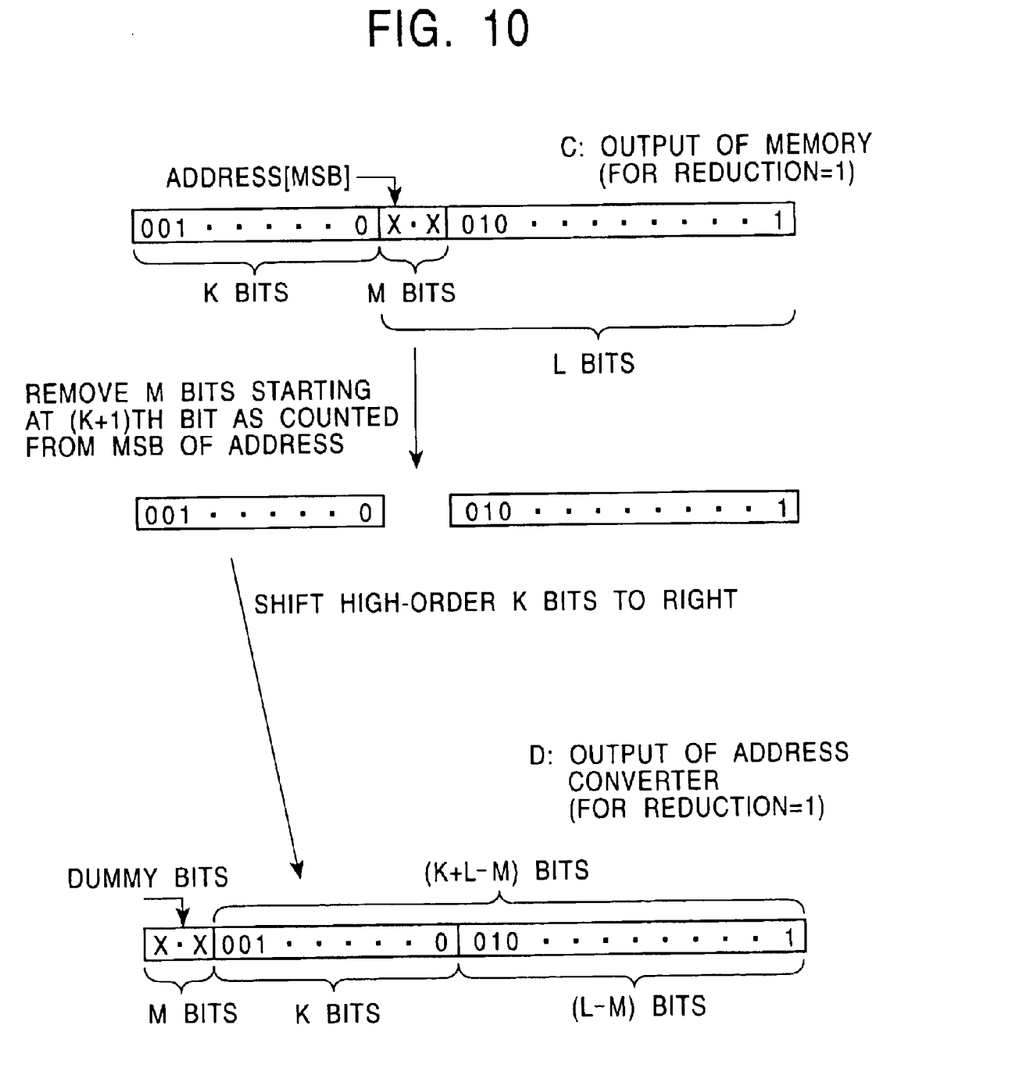
FIG. 10 is a conceptual diagram showing another example of the process of shifting an address in the CAM device according to the embodiment of the present invention.

FIG. 9 is a conceptual diagram showing another example of the operation of the address converter, and FIG. 10 is a conceptual diagram showing another example of the address shift operation.

In the examples shown in FIGS. 9 and 10, when there is a failed plane, the address converter 17 converts an address with a width (K+L) bits output from the memory part 14 into an address with a width (K+L−M) bits used in the outside of the CAM device 10 and outputs the resultant address from the CAM device 10 to the outside.

A (K+L)-bit address is output from the memory part 14. This address C includes, as shown in FIG. 10, a total of (K+L) bits including high-order K bits indicating a bank 20 and low-order L bits indicating specific one word in the bank 20. Of the low-order L bits, a bit corresponding to ADDRESS[L−1:L−M] is fixed to "0" or "1", and thus (L−M) bits excluding ADDRESS[L−1:L−M] are effective.

In the case in which the signal REDUCTION is "1", the address converter 17 performs an address conversion such that M bits corresponding to ADDRESS[L−1:L−M] are removed from the address C with the width (K+L) bits output from the memory part 14, and high-order K bits indicating a bank 20 are shifted by M bits to right in FIG. 10, that is, to lower-order locations. As a result, an address signal D with a width (K+L−M) bits is output from the address converter 17. The output address D with the width (K+L−M) bits is output to the outside via the address register 16.

On the other hand, in the case in which the signal REDUCTION is "0", that is, in the case in which there is no failed plane, no shifting is performed on both address input to the CAM device 10 from the outside and address output from the CAM device 10 to the outside. That is, in this case, an address with a width (K+L) bits is input to the CAM device 10 from the outside, an address with a width (K+L) bits is output from the CAM device 10 to the outside.

By performing the address conversion in the above-described manner, when the CAM device 10 is shipped as a CAM device having a memory capacity reduced to one half (when M=1), the CAM device 10 can be dealt with in the same manner as a CAM device originally designed to have a memory capacity equal to the reduced memory capacity of the CAM device 10.

Note that the CAM device according to the present invention is not limited to the details of the embodiments described above. That is, in an embodiment of the CAM device according to the present invention, the CAM device includes a circuit for, when a bank 20 includes a failed plane, disabling the failed plane in that bank 20 and also an arbitrary plane of each of all the other banks, thereby reducing the memory capacity of the memory part 14 to the reciprocal of a power of 2, wherein the circuit is not limited to a specific circuit configuration as long as the circuit has the capability described above.

The memory capacity of the memory part 14 is not limited to specific values. That is, the width in bits of the address and the width in bits of data are not limited to specific values. The memory part 14 may be divided into two or an arbitrary greater number of banks 20. Each of banks 20 may be divided into 2 or more planes the number of which is equal to a power of 2. There are no specific limitations on the internal structure of the banks 20 and the circuit configuration of the address converter.

The data width in bits of signals REDUCTION and FAILPLANE are not limited to specific values, and may be set to arbitrary values depending on the number of planes included in each bank 20. For example, in a case in which each bank 20 is divided into eight planes (that is, M=3), a 2-bit signal REDUCTION may be used to specify that the memory capacity of the memory part 14 is reduced to the reciprocal of a power of 2, such as ½, ¼, or ⅛. The signal FAILPLANE may be used in common for all banks 20, or a signal FAILPLANE may be set separately for each bank 20 to specify different planes depending on the banks 20. The signal REDUCTION may have a width greater than 2 bits so that the signal REDUCTION may specify a factor of reduction in memory capacity, such as ⅞, ⁶⁄₈, ⅝, . . . , and so on.

The bit indicating the bank number of a bank 20, the bit indicating an address of a word in the bank 20, the bit indicating a plane, and a dummy bit used in the address conversion are not limited to specific bits. Those bits may be assigned to arbitrary bits in an address. Furthermore, in the CAM according to the present invention, a redundant word may be provided in a bank or a plane such that it can be used instead of a failed word thereby avoiding the bank or plane from becoming unusable. This allows a further improvement in production yield of CAM devices.

The address converter 17 is not limited to the specific circuit configuration, as long as it is capable of, in the mode in which the memory capacity of the memory part 14 is reduced, performing a conversion between an address which has a particular number of bits corresponding to the memory capacity of the memory part 14 and which is used in the CAM device and an address which has a particular number of bits corresponding to the reduced memory capacity and which is used in the outside of the CAM.

In the embodiments described above, memory blocks are constructed in such a manner that each bank includes a plurality of planes. However, planes used in the embodiments described above may be replaced with banks, because planes are memory blocks which are configured basically in the same manner as banks and which can be controlled independently. That is, the encoder 24, the data selector 26, and the flag/address selector 28 which are disposed in each back in the embodiments described above may be disposed outside each bank (that is, outside the memory part 14) thereby making it possible to disabling a failed bank in a group including a plurality of banks. In this case, it is required to only slightly modify the address conversion such that the dummy bit locations are changed from the middle of the address to bit locations including the first bit of the address indicating a bank.

The CAM device according to the present invention has been described above.

It should be understood that the present invention is not limited to specific embodiments described in detail above, but various improvements and modifications are possible without departing from the scope of the invention.

What is claimed is:

1. A content addressable memory device, comprising:
   a memory part including a plurality of memory blocks which can be controlled independently of each other;
   a failed memory block information memory for, when there is a failed memory block, storing address information associated with the failed memory block and outputting a signal indicating the failed memory block; and
   an encoder for, in accordance with the signal and an address input, outputting a memory block selection signal to respective memory blocks to enable a memory block other than the failed memory block without enabling the failed memory block.

2. A content addressable memory device according to claim 1, wherein said encoder outputs a memory block selection signal in accordance with the signal, the address input, and further a capacity reduction signal which is input from the outside to specify an amount of reduction in memory capacity to enable the memory block other than the failed memory block without enabling the failed memory block.

3. A content addressable memory device according to claim 2, further comprising:
   a selector for selectively outputting data output from the respective memory blocks in accordance with the memory block selection signal output from the encoder; and
   a selector for selectively outputting, in accordance with predetermined priority, a flag indicating whether the memory block includes at least one hit word in the searching and the address of the hit word output from the memory block.

4. A content addressable memory device according to claim 3, further comprising:
   an address converter for performing an address conversion between an address having a particular number of bits used in the content addressable memory device and an address which has a particular number of bits corresponding to the reduced memory capacity and which is used in the outside of the content addressable memory device.

5. A content addressable memory device according to claim 4, wherein the address converter produces an address such that in a mode in which the memory capacity of the memory part is reduced to the reciprocal of a power of 2, when an address with a width in bits corresponding to the memory capacity reduced to the reciprocal of a power of 2 input to the content addressable memory device from the outside is given, the address converter inserts dummy bits, the number of which corresponds to at least one address bit specifying the memory block, at an address bit location specifying the memory block thereby producing an address with a width in bits equal to a specific value used in the content addressable memory device, while when an address with a particular width in bits is output from the memory part, the address converter removes bits, the number of which corresponds to the at least one address bit specifying the memory block, at bit locations specifying the memory block from the address thereby producing an address with a width in bits corresponding to the memory capacity reduced to the reciprocal of a power of 2.

6. A content addressable memory device according to claim 5, wherein the memory blocks are memory banks.

7. A content addressable memory device according to claim 5, wherein the memory blocks are planes in memory banks.

8. A content addressable memory device according to claim 1, wherein the failed memory block information memory also outputs a capacity reduction signal to specify the amount of reduction in the memory capacity of the memory part, and in accordance with the capacity reduction signal, the signal indicating the failed memory block, and an address input from the outside, the encoder outputs the memory block selection signal to the respective memory blocks to enable the memory block other than the failed memory block without enabling the failed memory block.

9. A content addressable memory device according to claim 8, further comprising:

a selector for selectively outputting data output from the respective memory blocks in accordance with the memory block selection signal output from the encoder; and a selector for selectively outputting, in accordance with predetermined priority, a flag indicating whether the memory block includes at least one hit word in the searching and the address of the hit word output from the memory block.

10. A content addressable memory device according to claim 9, further comprising:

an address converter for performing an address conversion between an address having a particular number of bits used in the content addressable memory device and an address which has a particular number of bits corresponding to the reduced memory capacity and which is used in the outside of the content addressable memory device.

11. A content addressable memory device according to claim 10, wherein, in a mode in which the memory capacity of the memory part is reduced to the reciprocal of a power of 2, the address converter produces an address such that when an address with a width in bits corresponding to the memory capacity reduced to the reciprocal of a power of 2 is input to the content addressable memory device from the outside, the address converter inserts dummy bits, the number of which corresponds to at least one address bit specifying the memory block, at an address bit location specifying the memory block thereby producing an address with a width in bits equal to a specific value used in the content addressable memory device, while when an address with a particular width in bits is output from the memory part, the address converter removes bits, the number of which corresponds to the at least one address bit specifying the memory block, at bit locations specifying the memory block from the address thereby producing an address with a width in bits corresponding to the memory capacity reduced to the reciprocal of a power of 2.

12. A content addressable memory device according to claim 11, wherein the memory blocks are memory banks.

13. A content addressable memory device according to claim 11, wherein the memory blocks are planes in memory banks.

14. A content addressable memory device comprising:

a memory part divided into a plurality of banks each of which includes a plurality of words and is divided into a plurality of planes;

a failed plane information memory for, when there is a failed plane, storing address information associated with the failed plane and outputting a signal indicating the failed plane; and a circuit for, when a bank includes one or more failed planes, disabling the failed planes of that plane and also disabling as many arbitrary planes in each of all the other banks as there are failed planes in the bank thereby reducing the memory capacity of the memory part.

15. A content addressable memory device according to claim 14, wherein each of the banks is divided into planes the number of which is equal to a power of 2.

16. A content addressable memory device according to claim 15, wherein the circuit for reducing the memory capacity of the memory part comprising:

an encoder disposed in each bank, for selecting one of planes in accordance with an address bit specifying the plane, said signal output from the failed plane information memory and indicating the failed plane, and a control signal indicating that the memory capacity of the memory part should be reduced;

a selector for selectively outputting data output from the respective planes in accordance with a selection signal output from the encoder; and a selector for selectively outputting, in accordance with predetermined priority, a flag indicating whether a plane includes at least one hit word in the searching and the address of the hit word output from the plane.

17. A content addressable memory device according to claim 16, wherein the control signal to reduce the memory capacity of the memory part is a signal input from the outside of the content addressable memory device.

18. A content addressable memory device according to claim 16, wherein the control signal to reduce the memory capacity of the memory part is a signal produced and output by the failed plane information memory.

19. A content addressable memory device according to claim 18, further comprising:

an address converter for, in a memory in which the memory capacity of the memory part is reduced, performing an address conversion between an address which has a particular number of bits corresponding to the memory capacity of the memory part and which is used in the content addressable memory device and an address which has a particular number of bits corresponding to the reduced memory capacity and which is used in the outside of the content addressable memory device.

20. A content addressable memory device according to claim 19, wherein the address converter produces an address such that in a mode in which the memory capacity of the memory part is reduced to the reciprocal of a power of 2, when an address with a width in bits corresponding to the memory capacity reduced to the reciprocal of a power of 2 input to the content addressable memory device from the outside is given, the address converter inserts dummy bits, the number of which corresponds to at least one address bit specifying the plane, at an address bit location specifying the plane thereby producing an address with a width in bits equal to a specific value used in the content addressable memory device, while when an address with a particular width in bits is output from the memory part, the address converter removes bits, the number of which corresponds to the at least one address bit specifying the plane, at bit locations specifying the plane block from the address thereby producing an address with a width in bits corresponding to the memory capacity reduced to the reciprocal of a power of 2.

* * * * *